US008717112B2

(12) United States Patent
Chang et al.

(10) Patent No.: US 8,717,112 B2
(45) Date of Patent: May 6, 2014

(54) INDUCTANCE-CAPACITANCE (LC) OSCILLATOR

(75) Inventors: Hong-Yeh Chang, New Taipei (TW); Yuan-Ta Chiu, Taipei (TW); Chia-Hung Chang, Chiayi County (TW); Chun-Jen Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 122 days.

(21) Appl. No.: 13/338,268

(22) Filed: Dec. 28, 2011

(65) Prior Publication Data

US 2013/0009715 A1   Jan. 10, 2013

(30) Foreign Application Priority Data

Jul. 6, 2011   (TW) .............................. 100123881 A

(51) Int. Cl.
*H03B 1/00*   (2006.01)

(52) U.S. Cl.
USPC ................... 331/167; 331/177 V; 331/117 R; 331/117 FE

(58) Field of Classification Search
CPC ....................................................... H03B 5/08
USPC ....... 331/177 V, 167, 116 R, 116 FE, 117 FE, 331/117 R
See application file for complete search history.

(56) References Cited

U.S. PATENT DOCUMENTS 7,411,468 B2   8/2008  Luong et al.
2009/0184774 A1   7/2009  Deng et al.

OTHER PUBLICATIONS

Yang et al., "Low Phase-Noise and Low-Power CMOS VCO Constructed in Current-Reused Configuration", IEEE Microwave and Wireless Components Letters, Feb. 2008, pp. 136-138, vol. 18.
Wei et al., "An Amplitude-Balanced Current-Reused CMOS VCO Using Spontaneous Transconductance Match Technique", IEEE Microwave and Wireless Components Letters, Jun. 2009, pp. 395-397, vol. 19, No. 6.
Chuang et al., "5-GHz Low Power Current-Reused Balanced CMOS Differential Armstrong VCOs", IEEE Microwave and Wireless Components Letters, Feb. 2007, pp. 139-141, vol. 17, No. 2.
Oh et al., "Current Reused LC VCOs", IEEE Microwave and Wireless Components Letters, Nov. 2005, pp. 736-738, vol. 15, No. 11.
Yun et al., "A 1mW Current-Reuse CMOS Differential LC-VCO with Low Phase Noise", IEEE International Solid-State Circuits Conference, Feb. 2005, pp. 540-541, p. 616.
Huang et al., "A 1 V 2.2 mW 7 GHz CMOS Quadrature VCO Using Current-Reuse and Cross-Coupled Transformer-Feedback Technology", IEEE Microwave and Wireless Components Letters, Oct. 2008, pp. 698-700, vol. 18, No. 10.

(Continued)

*Primary Examiner* — Arnold Kinkead
(74) *Attorney, Agent, or Firm* — Jianq Chyun IP Office

(57) ABSTRACT

An inductance-capacitance (LC) oscillator including a first varactor cell, a first transistor, a second transistor and a first pair of differential transformers is provided. The first varactor cell provides a first variable capacitance to adjust/tune the frequency of a first differential oscillation signal generated by the LC oscillator, and outputting the first differential oscillation signal. The first transistor is coupled between a core dc supply voltage and a first terminal of the first varactor cell. The second transistor is coupled between a ground potential and a second terminal of the first varactor cell. The first pair of differential transformers is connected in cascade with the first transistor and the second transistor between the core dc supply voltage and the ground potential, and is used for increasing the output-swing of the first differential oscillation signal, and making a current flowing through the first transistor to be reused by the second transistor.

34 Claims, 2 Drawing Sheets

(56) References Cited

OTHER PUBLICATIONS

Lee et al., "Current Reuse Cross-Coupling CMOS VCO Using the Center-Tapped Transformer in LC Tank for Digitally Controlled Oscillator", IEEE Radio Frequency Integrated Circuits Symposium, Jun. 2008, pp. 549-552.

Lee et al., "A Low Power Injection Locked LC-Tank Oscillator With Current Reused Topology", IEEE Microwave and Wireless Components Letters, Mar. 2007, pp. 220-222, vol. 17, No. 3.

Liu et al., "Low Power Current-reused Voltage-Controlled Oscillator with Optimum Source Damping Resistors", IEEE Conference on Electron Devices and Solid-State Circuits, Dec. 2007, pp. 1017-1020.

Wang et al., "A Current-reused VCO with Degenerated RC Components", IEEE Conference on Electron Devices and Solid-State Circuits, Dec. 2007, pp. 465-467.

Kuo et al., "A 1.7-mW, 16.8% Frequency Tuning, 24-GHz Transformer-Based LC-VCO using 0.18-µm CMOS Technology", IEEE Radio Frequency Integrated Circuits Symposium, Jul. 2009, pp. 79-82.

Huang et al., "A 1 V 2.2 mW 7 GHz CMOS Quadrature VCO Using Current-Reuse and Cross-Coupled Transformer-Feedback Technology," IEEE Microwave and Wireless Components Letters, Oct. 2008, pp. 698-700.

Kwok et al., "Ultra-low-Voltage high-performance CMOS VCOs using transformer feedback," IEEE Journal of Solid-State Circuits, Mar. 2005, pp. 652-660.

"Office Action of Taiwan Counterpart Application", issued on Feb. 24, 2014, p1-p7, in which the listed references were cited.

US 8,717,112 B2

INDUCTANCE-CAPACITANCE (LC) OSCILLATOR

CROSS-REFERENCE TO RELATED APPLICATION

This application claims the priority benefit of Taiwan application serial no. 100123881, filed on Jul. 6, 2011. The entirety of the above-mentioned patent application is hereby incorporated by reference herein and made a part of this specification.

BACKGROUND OF THE DISCLOSURE

1. Field of the Disclosure

The disclosure relates to an oscillator, more particularly, the disclosure relates to an inductance-capacitance (LC) oscillator.

2. Description of Related Art

As demands for transmission speed of data of a modern communication system are increased, a transceiver has to provide better transmission quality and wider bandwidth, so that an operating frequency and the bandwidth of the transceiver are required to be increased. Moreover, an oscillator (OSC) is highly related to phase noise in a phase-locked loop (PLL), which is also a critical circuit in the wireless communication system, and determines the transmission quality of the transceiver. The commonly used oscillators include ring oscillators and inductance-capacitance (LC) oscillators. Although the ring oscillator has wide bandwidth and low area, it has high dc power consumption and high phase noise, so that the LC oscillator is generally used.

SUMMARY OF THE DISCLOSURE

An exemplary embodiment of the disclosure provides an inductance-capacitance (LC) oscillator including a first varactor cell, a first transistor, a second transistor and a first pair of differential transformers. The first varactor cell is used for providing a first variable capacitance to tune the frequency of a first differential oscillation signal generated by the LC oscillator, and outputting the first differential oscillation signal. The first transistor is coupled between a core dc supply voltage and a first terminal of the first varactor cell. The second transistor is coupled between a ground potential and a second terminal of the first varactor cell. The first pair of differential transformers is connected in cascade with the first transistor and the second transistor between the core dc supply voltage and the ground potential, and is used for increasing the output swing of the first differential oscillation signal, and making a current flowing through the first transistor to be reused by the second transistor.

Another exemplary embodiment of the disclosure provides a method for generating a differential oscillation signal by using an LC oscillator, which adopts both a current reuse manner and a transformer feedback manner.

Another exemplary embodiment of the disclosure provides a method for generating M differential oscillation signals with N phases by using an LC oscillator, which adopts a current reuse manner, a transformer feedback manner and a cascade coupling manner at the same time, where N and M are positive integers, and N=2M.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate the embodiments of the disclosure and, together with the description, serve to explain the principles of the disclosure.

DETAILED DESCRIPTION OF DISCLOSED EMBODIMENTS

Figure 1:
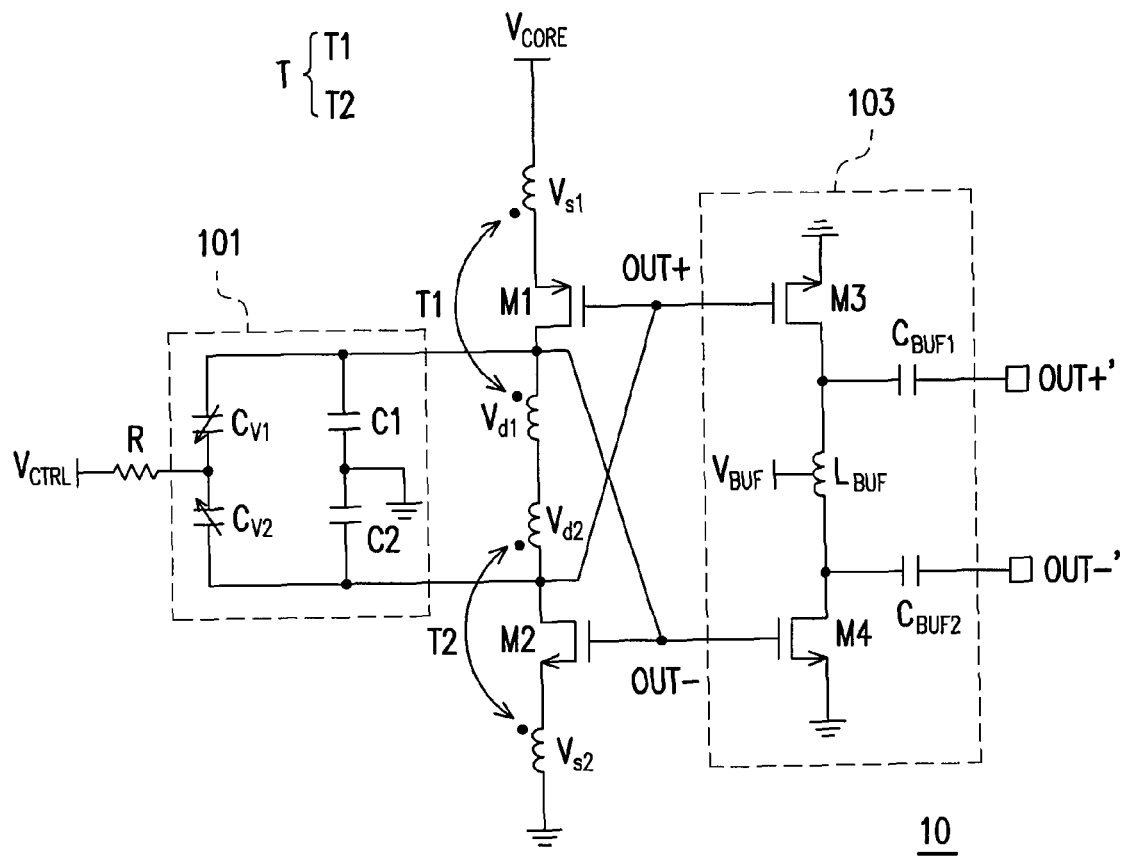
FIG. 1 is a schematic of an inductance-capacitance (LC) oscillator 10 according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic of an inductance-capacitance (LC) oscillator 10 according to an exemplary embodiment of the disclosure. Referring to FIG. 1, the LC oscillator 10 includes a varactor cell 101, transistors M1 and M2, a pair of differential transformers T and an output buffer unit 103.

In the present exemplary embodiment, the varactor cell 101 is used for providing a variable capacitance to adjust/tune the frequency of a differential oscillation signal (for example, a first oscillation signal OUT+ and a second oscillation signal OUT−) generated by the LC oscillator 10, and outputting the differential oscillation signal (OUT+, OUT−).

In detail, the varactor cell 101 may include two varactors $C_{V1}$ and $C_{V2}$. First ends of the varactors $C_{V1}$ and $C_{V2}$ receive a varactor control voltage $V_{CTRL}$ through a resistor R, and second ends of the varactors $C_{V1}$ and $C_{V2}$ are respectively served as a first terminal and a second terminal of the varactor cell 101, and are respectively coupled to the drains of the transistors M1 and M2.

In the present exemplary embodiment, the second ends of the varactors $C_{V1}$ and $C_{V2}$ are used for outputting the differential oscillation signal (OUT+, OUT−). Moreover, the varactor cell 101 may further include (fixed) capacitors C1 and C2. First ends of the capacitors C1 and C2 are respectively coupled to the second ends of the varactors $C_{V1}$ and $C_{V2}$, and second ends of the capacitors C1 and C2 are coupled to a ground potential. Basically, the capacitance provided by the varactor cell 101 can be adjusted in response to the varactor control voltage $V_{CTRL}$, so as to change the frequency of the differential oscillation signal (OUT+, OUT−) generated by the LC oscillator 10.

The transistor M1 can be implemented by a PMOS transistor, so that the transistor M1 is referred to as the PMOS transistor M1. The PMOS transistor M1 is coupled between the core dc supply voltage $V_{CORE}$ and the first terminal of the varactor cell 101. Moreover, the transistor M2 can be implemented by an NMOS transistor, so that the transistor M2 is referred to as the NMOS transistor M2. The NMOS transistor M2 is coupled between the ground potential and the second terminal of the varactor cell 101.

The pair of differential transformers T is connected in cascade with the PMOS transistor M1 and the NMOS transistor M2 between the core dc supply voltage WORE and the ground potential, and is used for increasing the output swing (amplitude) of the differential oscillation signal (OUT+, OUT−), and making a current flowing through the PMOS transistor M1 to be reused by the NMOS transistor M2 (i.e. current reuse).

In detail, the pair of differential transformers T includes two transformers T1 and T2. A secondary side $V_{s1}$ of the transformer T1 is coupled between the core dc supply voltage $V_{CORE}$ and the source of the PMOS transistor M1. A primary side $V_{d2}$ of the transformer T2 and a primary side $V_{d1}$ of the transformer T1 are connected in cascade between a drain of the PMOS transistor M1 and the drain of the NMOS transistor M2, and a secondary side $V_{s2}$ of the transformer T2 is coupled between the source of the NMOS transistor M2 and the ground potential. Moreover, the gate of the PMOS transistor M1 is coupled to the drain of the NMOS transistor M2, and the gate of the NMOS transistor M2 is coupled to the drain of the PMOS transistor M1.

In the present exemplary embodiment, an equivalent inductor of the transformers T1 and T2 and an equivalent capacitor of the varactor cell 101 may be formed as a resonator of the LC oscillator 10. Moreover, the PMOS transistor M1 and the NMOS transistor M2 can provide negative resistance through the cross-coupling pair, so as to compensate the loss of the resonator of the LC oscillator 10. In detail, the negative resistance provided by the PMOS transistor M1 and the NMOS transistor M2 is used to counteract a parasitic resistance of the resonator of the LC oscillator 10, so as to maintain stable oscillation of the LC oscillator 10.

On the other hand, under a feedback action of the transformers T1 and T2, the voltages on the drain and source of each of the PMOS transistor M1 and the NMOS transistor M2 may have the same phase. In this way, the feedback action of the transformers T1 and T2 can effectively enhance the output swing of the differential oscillation signal (OUT+, OUT−), which not only avails the LC oscillator 10 to be operated under a lower core dc supply voltage $V_{CORE}$, but also avails improving the output power of the LC oscillator 10 and reducing the phase noise of the LC oscillator 10. From the measurement, the output power of the LC oscillator 10 can be greater than −20 dBm, and in case of a offset frequency of 1 MHz, the phase noise of the LC oscillator 10 can be smaller than −109 dBc/Hz, though the disclosure is not limited thereto.

Moreover, in order to maintain/increase the signal quality of the differential oscillation signal (OUT+, OUT−) for providing to the related circuit for utilization, in the present exemplary embodiment, the output buffer unit 103 is coupled to the varactor cell 101, and used for receiving and boosting the differential oscillation signal (OUT+, OUT−), namely, the buffered first oscillation signal OUT+' and the buffered second oscillation signal OUT−'.

In detail, the output buffer unit 103 may include transistors M3 and M4, a differential inductor $L_{BUF}$, and two capacitors $C_{BUF1}$ and $C_{BUF2}$. The transistors M3 and M4 can all be implemented by NMOS transistors, so that the transistors M3 and M4 are referred to as NMOS transistors M3 and M4. The gate of the NMOS transistor M3 is coupled to the second end of the varactor $C_{V2}$, and the source of the NMOS transistor M3 is coupled to the ground potential. The gate of the NMOS transistor M4 is coupled to the second end of the varactor $C_{V1}$, and a source of the NMOS transistor M4 is coupled to the ground potential.

The differential inductor $L_{BUF}$ is an electronic device having three terminals. A first terminal of the differential inductor $L_{BUF}$ is coupled to a direct current (DC) bias voltage $V_{BUF}$, a second terminal of the differential inductor $L_{BUF}$ is coupled to the drain of the NMOS transistor M3, and a third terminal of the differential inductor $L_{BUF}$ is coupled to the drain of the NMOS transistor M4. Moreover, first ends of the capacitors $C_{BUF1}$ and $C_{BUF2}$ are respectively coupled to the drains of the NMOS transistors M3 and M4, and second ends of the capacitors $C_{BUF1}$ and $C_{BUF2}$ respectively output the buffered first oscillation signal OUT+' and second oscillation signal OUT−'. In this way, the signal quality of the differential oscillation signal (OUT+, OUT−) can be increased and provided to the related circuit for utilization.

Figure 2:
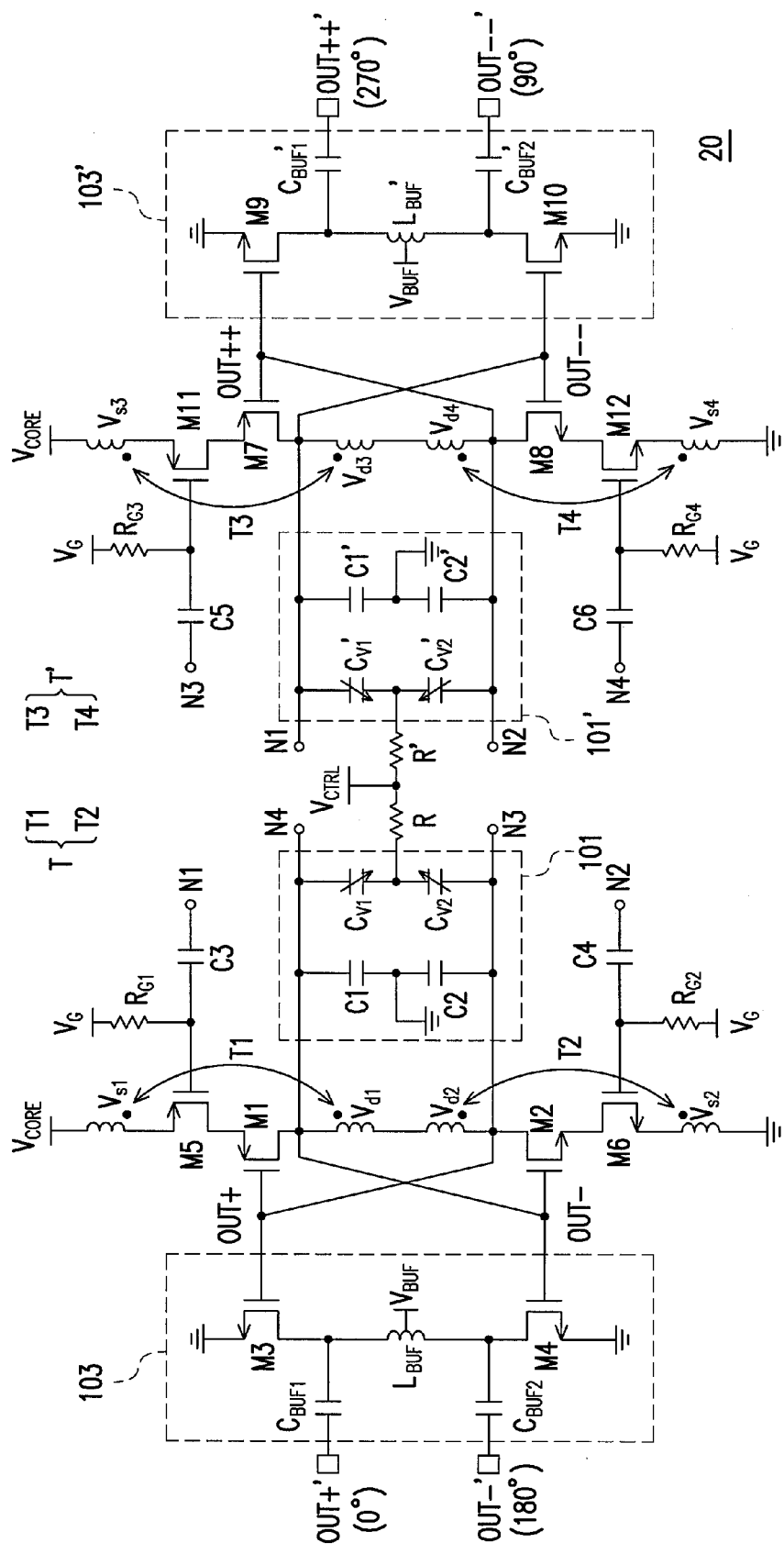
FIG. 2 is a schematic of an LC oscillator 20 according to another exemplary embodiment of the disclosure.

On the other hand, FIG. 2 is a circuit diagram of an LC oscillator 20 according to another exemplary embodiment of the disclosure. Referring to FIG. 2, compared to the LC oscillator 10 of FIG. 1 that has two phase outputs)(OUT+' (0°), OUT−'(180°)), the LC oscillator 20 of the present exemplary embodiment has four phase outputs ((OUT+'(0°), OUT−'(180°), OUT++'(270°), OUT−−'(90°)).

In detail, compared to the LC oscillator 10, the LC oscillator 20 further includes a varactor cell 101', transistors, M5, M6, M7, M8, M11 and M12, a pair of differential transformers T', resistors R', $R_{G1}$, $R_{G2}$, $R_{G3}$ and $R_{G4}$, capacitors C3-C6 and an output buffer unit 103'. The same referential numbers in FIG. 1 and FIG. 2 denote the similar coupling relations and functions, so that details thereof are not repeated. Therefore, only the differences there between are described below.

In the present exemplary embodiment, the varactor cell 101' is used for providing the variable capacitance to adjust/tune the frequency of a differential oscillation signal (for example, a third oscillation signal OUT++ and a fourth oscillation signal OUT−−) generated by the LC oscillator 20, and outputting the differential oscillation signal (OUT++, OUT−−). In detail, the varactor cell 101' may include two varactors $C_{V1}$' and $C_{V2}$'. First ends of the varactors $C_{V1}$' and $C_{V2}$' receive the varactor control voltage $V_{CTRL}$ through a resistor R', and second ends of the varactors $C_{V1}$' and $C_{V2}$' are respectively served as a first terminal and a second terminal of the varactor cell 101', and are respectively coupled to drains of the transistors M7 and M8.

In the present exemplary embodiment, the second ends of the varactors $C_{V1}$' and $C_{V2}$' are used for outputting the differential oscillation signal (OUT++, OUT−−). Moreover, the varactor cell 101' may further include (fixed) capacitors C1' and C2'. First ends of the capacitors C1' and C2' are respectively coupled to the second ends of the varactors $C_{V1}$' and $C_{V2}$', and second ends of the capacitors C1' and C2' are coupled to the ground potential. Similarly, the capacitance provided by the varactor cell 101' can by adjusted in response to the varactor control voltage $V_{CTRL}$, so as to change the frequency of the differential oscillation signal (OUT++, OUT−−) generated by the LC oscillator 20.

Moreover, the transistor M7 can be implemented by a PMOS transistor, so that the transistor M7 is referred to as the PMOS transistor M7. The PMOS transistor M7 is coupled between the core dc supply voltage $V_{CORE}$ and the first terminal of the varactor cell 101'. On the other hand, the transistor M8 can be implemented by an NMOS transistor, so that the transistor M8 is referred to as the NMOS transistor M8. The NMOS transistor M8 is coupled between the ground potential and the second terminal of the varactor cell 101'.

The pair of differential transformers T' is connected in cascade with the PMOS transistor M7 and the NMOS transistor M8 between the core dc supply voltage $V_{CORE}$ and the ground potential, and is used for increasing the output swing of the differential oscillation signal (OUT++, OUT−−), and making a current flowing through the PMOS transistor M7 to be reused by the NMOS transistor M8 (i.e. current reuse).

In detail, the pair of differential transformers T' includes two transformers T3 and T4. A secondary side $V_{s3}$ of the transformer T3 is coupled between the core dc supply voltage $V_{CORE}$ and the source of the PMOS transistor M7. A primary side $V_{d4}$ of the transformer T4 and a primary side $V_{d3}$ of the transformer T3 are connected in cascade between the drain of the PMOS transistor M7 and the drain of the NMOS transistor M8, and a secondary side $V_{s4}$ of the transformer T4 is coupled between the source of the NMOS transistor M8 and the ground potential. Moreover, the gate of the PMOS transistor M7 is coupled to the drain of the NMOS transistor M8, and a gate of the NMOS transistor M8 is coupled to the drain of the PMOS transistor M7.

On the other hand, the transistor M5 can be implemented by a PMOS transistor, so that the transistor M5 is a referred to as the PMOS transistor M5. The PMOS transistor M5 is coupled between a first end of the secondary side $V_{s1}$ of the transformer T1 and the source of the PMOS transistor M1, where the source of the PMOS transistor M5 is coupled to the first end of the secondary side $V_{s1}$ of the transformer T1, the drain of the PMOS transistor M5 is coupled to the source of the PMOS transistor M1, and a second end of the secondary side $V_{s1}$ of the transformer T1 is coupled to the core dc supply voltage $V_{CORE}$. A first end of the resistor $R_{G1}$ is used for receiving a gate control voltage $V_G$, and a second end of the resistor $R_{G1}$ is coupled to a gate of the PMOS transistor M5. A first end of the capacitor C3 is coupled to the gate of the PMOS transistor M5, and a second end of the capacitor C3 is coupled to a node N1 and the second end of the varactor $C_{V1}'$.

The transistor M6 can be implemented by an NMOS transistor, so that the transistor M6 is a referred to as the NMOS transistor M6. The NMOS transistor M6 is coupled between a first end of the secondary side $V_{s2}$ of the transformer T2 and the source of the NMOS transistor M2, where the source of the NMOS transistor M6 is coupled to the first end of the secondary side $V_{s2}$ of the transformer T2, the drain of the NMOS transistor M6 is coupled to the source of the NMOS transistor M2, and a second end of the secondary side $V_{s2}$ of the transformer T2 is coupled to the ground potential. A first end of the resistor $R_{G2}$ is used for receiving the gate control voltage $V_G$, and a second end of the resistor $R_{G2}$ is coupled to a gate of the NMOS transistor M6. A first end of the capacitor C4 is coupled to the gate of the NMOS transistor M6, and a second end of the capacitor C4 is coupled to a node N2 and the second end of the varactor $C_{V2}'$.

The transistor M11 can be implemented by a PMOS transistor, so that the transistor M11 is a referred to as the PMOS transistor M11. The PMOS transistor M11 is coupled between a first end of the secondary side $V_{s3}$ of the transformer T3 and the source of the PMOS transistor M7, where the source of the PMOS transistor M11 is coupled to the first end of the secondary side $V_{s3}$ of the transformer T3, the drain of the PMOS transistor M11 is coupled to the source of the PMOS transistor M7, and a second end of the secondary side $V_{s3}$ of the transformer T3 is coupled to the core dc supply voltage $V_{CORE}$. A first end of the resistor $R_{G3}$ is used for receiving the gate control voltage $V_G$, and a second end of the resistor $R_{G3}$ is coupled to the gate of the PMOS transistor M11. A first end of the capacitor C5 is coupled to the gate of the PMOS transistor M11, and a second end of the capacitor C5 is coupled to a node N3 and the second end of the varactor $C_{V2}$.

The transistor M12 can be implemented by an NMOS transistor, so that the transistor M12 is a referred to as the NMOS transistor M12. The NMOS transistor M12 is coupled between a first end of the secondary side $V_{s4}$ of the transformer T4 and the source of the NMOS transistor M8, where a source of the NMOS transistor M12 is coupled to the first end of the secondary side $V_{s4}$ of the transformer T4, a drain of the NMOS transistor M12 is coupled to the source of the NMOS transistor M8, and a second end of the secondary side $V_{s4}$ of the transformer T4 is coupled to the ground potential. A first end of the resistor $R_{G4}$ is used for receiving the gate control voltage $V_G$, and a second end of the resistor $R_{G4}$ is coupled to a gate of the NMOS transistor M12. A first end of the capacitor C6 is coupled to the gate of the NMOS transistor M12, and a second end of the capacitor C6 is coupled to a node N4 and the second end of the varactor $C_{V1}$.

In this way, a method and principle for the LC oscillator 20 generating the differential oscillation signal (OUT++, OUT−−) are similar to that for the LC oscillator 10 generating the differential oscillation signal (OUT+, OUT−), so that details thereof are not repeated. Similarly, in order to maintain/increase the signal quality of the differential oscillation signal (OUT++, OUT−−) for providing to the related circuit for utilization, in the present exemplary embodiment, the output buffer unit 103' is coupled to the varactor cell 101', and used for receiving and boosting the differential oscillation signal (OUT++, OUT−−), namely, the buffered third oscillation signal OUT++' and the buffered fourth oscillation signal OUT−−'.

In detail, the output buffer unit 103' may include transistors M9 and M10, a differential inductor $L_{BUF}'$, and two capacitors $C_{BUF1}'$ and $C_{BUF2}'$. The transistors M9 and M10 can all be implemented by NMOS transistors, so that the transistors M9 and M10 are referred to as NMOS transistors M9 and M10. The gate of the NMOS transistor M9 is coupled to the second end of the varactor $C_{V2}'$, and the source of the NMOS transistor M9 is coupled to the ground potential. The gate of the NMOS transistor M10 is coupled to the second end of the varactor $C_{V1}'$, and a source of the NMOS transistor M10 is coupled to the ground potential.

The differential inductor $L_{BUF}'$ is an electronic device having three terminals. A first terminal of the differential inductor $L_{BUF}'$ is coupled to the DC bias voltage $V_{BUF}$, a second terminal of the differential inductor $L_{BUF}'$ is coupled to the drain of the NMOS transistor M9, and a third terminal of the differential inductor $L_{BUF}'$ is coupled to the drain of the NMOS transistor M10. Moreover, first ends of the capacitors $C_{BUF1}'$ and $C_{BUF2}'$ are respectively coupled to the drains of the NMOS transistors M9 and M10, and second ends of the capacitors $C_{BUF1}'$ and $C_{BUF2}'$ respectively output the buffered third oscillation signal OUT++' and fourth oscillation signal OUT−−'. In this way, the signal quality of the differential oscillation signal (OUT++, OUT−−) is increased and provided to the related circuit for utilization.

It should be noticed that due to the added part of FIG. 2, the LC oscillator 20 has four phase outputs)((OUT+'(0°), OUT−'(180°), OUT++'(270°), OUT−−'(90°)). In other words, phase differences between the first oscillation signal OUT+ and the oscillation signals OUT−, OUT++ and OUT−− are respectively 180°, 270° and 90°. Therefore, the LC oscillator 20 having four phase outputs can be applied to a direct-conversion transceiver system, though the disclosure is not limited thereto.

Of course, according to the descriptions of the exemplary embodiments of FIG. 1 and FIG. 2, those skilled in the art can deduce an implementation method of the LC oscillator capable of generating M differential oscillation signals with N phases (N and M are positive integer and N=2M) according to a current reuse manner (i.e. cascade connection of the PMOS transistor M1/M7 and the NMOS transistor M2/M8), a transformer feedback manner (i.e. a feedback effect/action formed by the transformers T1/T3 and T2/T4) and a cascade coupling manner (i.e. adding of the PMOS transistor M5/M11 and the NMOS transistor M6/M12), and details thereof are not repeated herein.

In summary, the LC oscillator 10/20 of the disclosure simultaneously uses the current reuse architecture (i.e. cascade connection of the PMOS transistor M1/M7 and the NMOS transistor M2/M8) and the transformer feedback technique (i.e. the feedback effect formed by the transformers T1/T3 and T2/T4) to achieve both low dc power consumption and low phase noise. Therefore, the LC oscillator 10/20 of the disclosure can be applied to a transceiver system of a wire or wireless communication device.

Moreover, since the LC oscillator 10/20 of the disclosure has low phase noise, it can be applied to various systems, for example, a multi-phase clock generating circuit, a vehicle radar system, and a microwave and millimeter-wave circuit system, etc., and the circuit configuration of the LC oscillator 10/20 can be implemented through a low cost silicon-based process, so that practicability thereof is improved.

Besides, any oscillation circuit structure that simultaneously uses the current reuse manner/architecture and the transformer feedback manner/technique in the single oscillator to implement the oscillation is considered to be within the scope of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An inductance-capacitance (LC) oscillator, comprising:
a first varactor cell, providing a first variable capacitance to tune a frequency of a first differential oscillation signal generated by the LC oscillator, and outputting the first differential oscillation signal;
a first transistor, coupled between a core dc supply voltage and a first terminal of the first varactor cell;
a second transistor, coupled between a ground potential and a second terminal of the first varactor cell; and
a first pair of differential transformers, connected in cascade with the first transistor and the second transistor between the core dc supply voltage and the ground potential, for increasing an output swing of the first differential oscillation signal, and making a current flowing through the first transistor to be reused by the second transistor,
wherein the first pair of differential transformers provides a feedback action, such that under the feedback action provided by the first pair of differential transformers, voltages on a drain and a source of each of the first and the second transistors have the same phase.

2. The LC oscillator as claimed in claim 1, wherein the first pair of differential transformers comprises:
a first transformer, having a secondary side coupled between the core dc supply voltage and the source of the first transistor; and
a second transformer, having a primary side connected in cascade with a primary side of the first transformer between the drain of the first transistor and the drain of the second transistor, and a secondary side coupled between the source of the second transistor and the ground potential.

3. The LC oscillator as claimed in claim 2, wherein a gate of the first transistor is coupled to the drain of the second transistor, and a gate of the second transistor is coupled to the drain of the first transistor.

4. The LC oscillator as claimed in claim 3, wherein the first transistor is a PMOS transistor, and the second transistor is an NMOS transistor.

5. The LC oscillator as claimed in claim 3, wherein the first varactor cell comprises:
a first varactor, having a first end receiving a varactor control voltage, and a second end to be served as the first terminal of the first varactor cell and coupled to the drain of the first transistor; and
a second varactor, having a first end receiving the varactor control voltage, and a second end to be served as the second terminal of the first varactor cell and coupled to the drain of the second transistor,
wherein the second ends of the first and the second varactors output the first differential oscillation signal.

6. The LC oscillator as claimed in claim 5, wherein the first ends of the first and the second varactors receive the varactor control voltage through a first resistor.

7. The LC oscillator as claimed in claim 5, wherein the first varactor cell further comprises:
a first capacitor, having a first end coupled to the second end of the first varactor, and a second end coupled to the ground potential; and
a second capacitor, having a first end coupled to the second end of the second varactor, and a second end coupled to the ground potential.

8. The LC oscillator as claimed in claim 7, further comprising:
an output buffer unit, coupled to the first varactor cell, for receiving and boosting the first differential oscillation signal.

9. The LC oscillator as claimed in claim 8, wherein the first differential oscillation signal comprises a first oscillation signal and a second oscillation signal, and the output buffer unit comprises:
a third transistor, having a gate coupled to the second end of the second varactor, and a source coupled to the ground potential;
a fourth transistor, having a gate coupled to the second end of the first varactor, and a source coupled to the ground potential;
a differential inductor, having a first terminal coupled to a direct current (DC) bias, a second terminal coupled to a drain of the third transistor, and a third terminal coupled to a drain of the fourth transistor;
a third capacitor, having a first end coupled to the drain of the third transistor, and a second end outputting the first oscillation signal; and
a fourth capacitor, having a first end coupled to the drain of the fourth transistor, and a second end outputting the second oscillation signal.

10. The LC oscillator as claimed in claim 9, wherein the third and the fourth transistors are NMOS transistors.

11. The LC oscillator as claimed in claim 1, further comprising:
a second varactor cell, providing a second variable capacitance to tune a frequency of a second differential oscillation signal generated by the LC oscillator, and outputting the second differential oscillation signal;
a third transistor, coupled between the core dc supply voltage and a first terminal of the second varactor cell;
a fourth transistor, coupled between the ground potential and a second terminal of the second varactor cell; and
a second pair of differential transformers, connected in cascade with the third transistor and the fourth transistor between the core dc supply voltage and the ground potential, for increasing an amplitude of the second differential oscillation signal, and making a current flowing through the third transistor to be reused by the fourth transistor.

12. The LC oscillator as claimed in claim 11, wherein the first pair of differential transformers comprises:
  a first transformer, having a secondary side coupled between the core dc supply voltage and the source of the first transistor; and
  a second transformer, having a primary side connected in cascade with a primary side of the first transformer between the drain of the first transistor and the drain of the second transistor, and a secondary side coupled between the source of the second transistor and the ground potential.

13. The LC oscillator as claimed in claim 12, wherein the second pair of differential transformers comprises:
  a third transformer, having a secondary side coupled between the core dc supply voltage and a source of the third transistor; and
  a fourth transformer, having a primary side connected in cascade with a primary side of the third transformer between a drain of the third transistor and a drain of the fourth transistor, and a secondary side coupled between a source of the fourth transistor and the ground potential.

14. The LC oscillator as claimed in claim 13, further comprising:
  a fifth transistor, coupled between a first end of the secondary side of the first transformer and the source of the first transistor, wherein a source of the fifth transistor is coupled to the first end of the secondary side of the first transformer, a drain of the fifth transistor is coupled to the source of the first transistor, and a second end of the secondary side of the first transformer is coupled to the core dc supply voltage;
  a first resistor, having a first end receiving a gate control voltage, and a second end coupled to a gate of the fifth transistor; and
  a first capacitor, having a first end coupled to the gate of the fifth transistor, and a second end coupled to a first node.

15. The LC oscillator as claimed in claim 14, further comprising:
  a sixth transistor, coupled between a first end of the secondary side of the second transformer and the source of the second transistor, wherein a source of the sixth transistor is coupled to the first end of the secondary side of the second transformer, a drain of the sixth transistor is coupled to the source of the second transistor, and a second end of the secondary side of the second transformer is coupled to the ground potential;
  a second resistor, having a first end receiving the gate control voltage, and a second end coupled to a gate of the sixth transistor; and
  a second capacitor, having a first end coupled to the gate of the sixth transistor, and a second end coupled to a second node.

16. The LC oscillator as claimed in claim 15, further comprising:
  a seventh transistor, coupled between a first end of the secondary side of the third transformer and the source of the third transistor, wherein a source of the seventh transistor is coupled to the first end of the secondary side of the third transformer, a drain of the seventh transistor is coupled to the source of the third transistor, and a second end of the secondary side of the third transformer is coupled to the core dc supply voltage;
  a third resistor, having a first end receiving the gate control voltage, and a second end coupled to a gate of the seventh transistor; and
  a third capacitor, having a first end coupled to the gate of the seventh transistor, and a second end coupled to a third node.

17. The LC oscillator as claimed in claim 16, further comprising:
  an eighth transistor, coupled between a first end of the secondary side of the fourth transformer and the source of the fourth transistor, wherein a source of the eighth transistor is coupled to the first end of the secondary side of the fourth transformer, a drain of the eighth transistor is coupled to the source of the fourth transistor, and a second end of the secondary side of the fourth transformer is coupled to the ground potential;
  a fourth resistor, having a first end receiving the gate control voltage, and a second end coupled to a gate of the eighth transistor; and
  a fourth capacitor, having a first end coupled to the gate of the eighth transistor, and a second end coupled to a fourth node.

18. The LC oscillator as claimed in claim 17, wherein the gate of the first transistor is coupled to the drain of the second transistor, and the gate of the second transistor is coupled to the drain of the first transistor; and
  the gate of the third transistor is coupled to the drain of the fourth transistor, and the gate of the fourth transistor is coupled to the drain of the third transistor.

19. The LC oscillator as claimed in claim 18, wherein the first, the third, the fifth and the seventh transistors are PMOS transistors, and the second, the fourth, the sixth and the eighth transistors are NMOS transistors.

20. The LC oscillator as claimed in claim 18, wherein the first varactor cell comprises:
  a first varactor, having a first end receiving a varactor control voltage, and a second end to be served as the first terminal of the first varactor cell and coupled to the drain of the first transistor and the fourth node; and
  a second varactor, having a first end receiving the varactor control voltage, and a second end to be served as the second terminal of the first varactor cell and coupled to the drain of the second transistor and the third node,
  wherein the second ends of the first and the second varactors output the first differential oscillation signal.

21. The LC oscillator as claimed in claim 20, wherein the first ends of the first and the second varactors receive the varactor control voltage through a fifth resistor.

22. The LC oscillator as claimed in claim 20, wherein the first varactor cell further comprises:
  a fifth capacitor, having a first end coupled to the second end of the first varactor, and a second end coupled to the ground potential; and
  a sixth capacitor, having a first end coupled to the second end of the second varactor, and a second end coupled to the ground potential.

23. The LC oscillator as claimed in claim 22, further comprising:
  a first output buffer unit, coupled to the first varactor cell, for receiving and boosting the first differential oscillation signal.

24. The LC oscillator as claimed in claim 23, wherein the first differential oscillation signal comprises a first oscillation signal and a second oscillation signal, and the first output buffer unit comprises:

a ninth transistor, having a gate coupled to the second end of the second varactor, and a source coupled to the ground potential;

a tenth transistor, having a gate coupled to the second end of the first varactor, and a source coupled to the ground potential;

a first differential inductor, having a first terminal coupled to a DC bias, a second terminal coupled to a drain of the ninth transistor, and a third terminal coupled to a drain of the tenth transistor;

a seventh capacitor, having a first end coupled to the drain of the ninth transistor, and a second end outputting the first oscillation signal; and an eighth capacitor, having a first end coupled to the drain of the tenth transistor, and a second end outputting the second oscillation signal.

25. The LC oscillator as claimed in claim 24, wherein the ninth and the tenth transistors are NMOS transistors.

26. The LC oscillator as claimed in claim 24, wherein the second varactor cell comprises:
a third varactor, having a first end receiving the varactor control voltage, and a second end to be served as the first terminal of the second varactor cell and coupled to the drain of the third transistor and the first node; and a fourth varactor, having a first end receiving the varactor control voltage, and a second end to be served as the second terminal of the second varactor cell and coupled to the drain of the fourth transistor and the second node, wherein the second ends of the third and the fourth varactors output the second differential oscillation signal.

27. The LC oscillator as claimed in claim 26, wherein the first ends of the third and the fourth varactors receive the varactor control voltage through a sixth resistor.

28. The LC oscillator as claimed in claim 26, wherein the second varactor cell further comprises:
a ninth capacitor, having a first end coupled to the second end of the third varactor, and a second end coupled to the ground potential; and a tenth capacitor, having a first end coupled to the second end of the fourth varactor, and a second end coupled to the ground potential.

29. The LC oscillator as claimed in claim 28, further comprising:
a second output buffer unit, coupled to the second varactor cell, for receiving and boosting the second differential oscillation signal.

30. The LC oscillator as claimed in claim 29, wherein the second differential oscillation signal comprises a third oscillation signal and a fourth oscillation signal, and the second output buffer unit comprises:
an eleventh transistor, having a gate coupled to the second end of the fourth varactor, and a source coupled to the ground potential;

a twelfth transistor, having a gate coupled to the second end of the third varactor, and a source coupled to the ground potential;

a second differential inductor, having a first terminal coupled to the DC bias, a second terminal coupled to a drain of the eleventh transistor, and a third terminal coupled to a drain of the twelfth transistor;

an eleventh capacitor, having a first end coupled to the drain of the eleventh transistor, and a second end outputting the third oscillation signal; and a twelfth capacitor, having a first end coupled to the drain of the twelfth transistor, and a second end outputting the fourth oscillation signal.

31. The LC oscillator as claimed in claim 30, wherein the eleventh and the twelfth transistors are NMOS transistors.

32. The LC oscillator as claimed in claim 30, wherein phase differences between the first oscillation signal and the second, the third and the fourth oscillation signals are respectively 180°, 270° and 90°.

33. A method for generating a differential oscillation signal by using an inductance-capacitance (LC) oscillator, comprising simultaneously using a current reuse manner implemented by a cascade of P-type transistor and N-type transistor and a transformer feedback manner implemented by a pair of differential transformers connected in cascade with the P-type transistor and the N-type transistor, so as to generate the differential oscillation signal, wherein the pair of differential transformers provides a feedback action, such that under the feedback action provided by the pair of differential transformers, voltages on a drain and a source of each of P-type transistor and the N-type transistor have the same phase.

34. A method for generating M differential oscillation signals with N phases by using an LC oscillator, comprising simultaneously using a current reuse manner implemented by M cascades of first P-type transistor and first N-type transistor, a transformer feedback manner implemented by M pairs of differential transformers respectively connected in cascade with the M cascades of first P-type transistor and the first N-type transistor, and a cascade coupling manner implemented by M cascades of second P-type transistor and second N-type transistor respectively connected in cascade with the M cascades of first P-type transistor and the first N-type transistor and the M pairs of differential transformers, so as to generate the M differential oscillation signals with N phases, where N and M are positive integers, and N=2M, wherein each of the M pairs of differential transformers provides a feedback action, such that under the feedback action provided by each of the M pairs of differential transformers, voltages on a drain and a source of each first P-type transistor and each first N-type transistor have the same phase.

* * * * *